(12) United States Patent
Matsuno et al.

(10) Patent No.: US 8,569,123 B2
(45) Date of Patent: Oct. 29, 2013

(54) METHOD FOR MANUFACTURING SILICON CARBIDE SEMICONDUCTOR DEVICE

(75) Inventors: Yoshinori Matsuno, Tokyo (JP); Kenichi Ohtsuka, Tokyo (JP); Naoki Yutani, Tokyo (JP); Kenichi Kuroda, Tokyo (JP); Hiroshi Watanabe, Tokyo (JP); Shozo Shikama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/258,941

(22) PCT Filed: Sep. 1, 2009

(86) PCT No.: PCT/JP2009/004284
§ 371 (c)(1),
(2), (4) Date: Sep. 22, 2011

(87) PCT Pub. No.: WO2010/119491
PCT Pub. Date: Oct. 21, 2010

(65) Prior Publication Data
US 2012/0028453 A1 Feb. 2, 2012

(30) Foreign Application Priority Data
Apr. 16, 2009 (JP) ................................ 2009-099972

(51) Int. Cl.
*H01L 21/338* (2006.01)
(52) U.S. Cl.
USPC .................... 438/167; 438/931; 257/E51.009
(58) Field of Classification Search
USPC .................. 438/167, 931, 522; 257/E51.009
See application file for complete search history.

(56) References Cited

U.S. PATENT DOCUMENTS 3,886,583 A * 5/1975 Wang ............................ 257/407
(Continued)

FOREIGN PATENT DOCUMENTS

| CN | 101385146 A | 3/2009 |
|----|-------------|--------|
| JP | 2000 049167 | 2/2000 |

(Continued)

OTHER PUBLICATIONS

Machine translation of JP 2002-261275 access from PAJ on Oct. 5, 2012.*

(Continued)

*Primary Examiner* — Allen Parker
(74) *Attorney, Agent, or Firm* — Oblon, Spivak, McClelland, Maier & Neustadt, L.L.P.

(57) ABSTRACT

An object is to provide a method for manufacturing a silicon carbide semiconductor device in which a time required for removing a sacrificial oxide film can be shortened and damage to a surface of the silicon carbide layer can be reduced. The method for manufacturing a silicon carbide semiconductor device includes: (a) performing ion implantation to a silicon carbide layer; (b) performing activation annealing to the ion-implanted silicon carbide layer 2; (c) removing a surface layer of the silicon carbide layer 2, to which the activation annealing has been performed, by dry etching; (d) forming a sacrificial oxide film on a surface layer of the silicon carbide layer, to which the dry etching has been performed, by performing sacrificial oxidation thereto; and (e) removing the sacrificial oxide film by wet etching.

8 Claims, 5 Drawing Sheets

(56) References Cited

U.S. PATENT DOCUMENTS

| | | | | |
|---|---|---|---|---|
| 4,586,980 | A * | 5/1986 | Hirai et al. | 216/99 |
| 5,385,855 | A * | 1/1995 | Brown et al. | 438/238 |
| 6,255,172 | B1 * | 7/2001 | Huang et al. | 438/266 |
| 6,294,444 | B1 * | 9/2001 | Ueno | 438/514 |
| 2003/0161575 | A1 * | 8/2003 | Tu | 385/16 |
| 2008/0105949 | A1 * | 5/2008 | Zhang et al. | 257/584 |
| 2012/0058617 | A1 | 3/2012 | Watanabe et al. | |

FOREIGN PATENT DOCUMENTS

| | | |
|---|---|---|
| JP | 2001 035838 | 2/2001 |
| JP | 2002 261275 | 9/2002 |
| JP | 2004 363326 | 12/2004 |
| JP | 2006 332495 | 12/2006 |
| JP | 2007 115875 | 5/2007 |
| JP | 2008 053418 | 3/2008 |
| KR | 10-2008-0074992 | 8/2008 |

OTHER PUBLICATIONS

Doolittle. "Lecture 4 Oxidation (applies only to Si and SiC only)". Retrieved from http://web.archive.org/web/20070129000421/http://users.ece.gatech.edu/~alan/ECE6450/Lectures/ECE6450L4-Oxidation%20Chap%204.pdf.*

International Search Report Issued Nov. 24, 2009 in PCT/JP09/004284 Filed Sep. 1, 2009.

Korean Office Action issued Oct. 15, 2012, in Patent Application No. 10-2011-7024045 (with English-language translation).

In-Ho Kang, et al., "Post Annealing Etch Process for Improved Reverse Characteristics of 4H-SiC Diode", Materials Science Forum, vols. 615-617, 2009, pp. 663-666.

Korean Office Action issued Feb. 18, 2013, in Patent Application No. 10-2011-7024045 (with English-language translation).

Office Action issued May 7, 2013, in Japanese Patent Application No. 2011-509095 (w/English translation).

Office Action issued May 29, 2013, in Chinese Patent Application No. 200980158694.9 (with English Translation).

* cited by examiner

| PROPORTION OF ACCEPTED PRODUCTS | | NUMBER OF SACRIFICIAL OXIDATION OPERATIONS | | |
|---|---|---|---|---|
| | | 0 | 1 | 2 |
| RIE ETCHING AMOUNT [nm] | 0 | 5% (#1) | 14% (#2) | 30% (#3) |
| | 60 | | 19% (#4) | |
| | 120 | | 38% (#6) | 41% (#7) |
| | 240 | | 49% (#5) | |

METHOD FOR MANUFACTURING SILICON CARBIDE SEMICONDUCTOR DEVICE

TECHNICAL FIELD

The present invention relates to a method for manufacturing a silicon carbide semiconductor device. More particularly, the invention relates to a method for manufacturing a silicon carbide Schottky diode.

BACKGROUND ART

A silicon carbide (SiC) Schottky diode having resistance to high voltages on the order of kV is configured of an n-type epitaxial layer constituted of SiC and a Schottky electrode formed thereon. In this structure, electric field is apt to concentrate at the periphery of the joint surface between the epitaxial layer and the Schottky electrode. It is therefore necessary that a p-type termination structure for alleviating the electric-field concentration should be formed on a surface layer of the periphery of the joint surface (Schottky joint surface).

For forming the p-type termination structure, a method, in which ions of a p-type impurity such as Al (aluminum) or B (boron) are implanted in an n-type epitaxial layer and activation annealing is performed to the layer through a high-temperature heat treatment at about 1,500° C. or higher, is generally used. For forming a Schottky junction having satisfactory properties, it is necessary to remove the altered layer which has been formed in the SiC surface as a result of the high-temperature heat treatment. Known as techniques for removing the altered layer are, for example, the techniques described in patent documents 1 to 3.

Patent document 1 describes, as a technique for removing the altered layer, a technique in which sacrificial oxidation is performed to a surface layer of the SiC after the activation annealing to form a sacrificial oxide film having a thickness of 40 nm or more but less than 140 nm as a surface layer, and the altered layer is removed together with the sacrificial oxide film.

Patent document 2 describes a technique in which a native oxide film is removed by a treatment with hydrofluoric acid and the surface of the SiC is subsequently cleaned by etching with plasma of a hydrogen/oxygen mixture gas or plasma of a gas containing fluorine atoms.

Patent document 3 describes that an altered layer having a thickness of about 100 nm generates and the altered layer having a thickness of about 100 nm is removed by etching or polishing in an atmosphere containing hydrogen.

PRIOR-ART DOCUMENTS

Patent Documents

Patent Document 1: JP-A-2008-53418
Patent Document 2: JP-A-2001-35838
Patent Document 3: JP-A-2004-363326

SUMMARY OF THE INVENTION

Problems that the Invention is to Solve

However, the inventor of the present invention has found that the thickness of the altered layer, which has been formed as a result of the activation annealing, has a thickness of about 100-200 nm and that there are cases where the layer thickness reaches a large value of about 200 nm, depending on the activation annealing conditions. When an altered layer having a thickness of about 200 nm is removed by conducting sacrificial oxidation once or repeatedly as described in patent document 1, there have been cases where the resultant-SiC surface exposed after removal of the sacrificial oxide film has enhanced surface irregularities, e.g., bunching steps, resulting in an increase in leakage current. In addition, when the thickness of the sacrificial oxide film is increased according to the thickness of the altered layer, there have been cases where a problem characteristic of SiC, such as the problem concerning the behavior of excess residual carbon, a problem that the formation of the sacrificial oxide film requires much time and a problem that removal of the sacrificial oxide film requires much time, occurs.

In the case where an altered layer is removed mainly by etching as described in patent documents 2 and 3, the time required for the removal of the sacrificial oxide film is shortened. However, there have been cases, especially when the technique finally used for removal is a plasma treatment, where new damage is caused to the SiC surface.

The invention has been achieved in order to overcome the problems described above. An object of the invention is to provide a method for manufacturing a silicon carbide semiconductor device in which an altered layer on a SiC surface can be sufficiently removed, the time required for removing a sacrificial oxide film can be shortened, and damage to the surface of the silicon carbide layer can be diminished.

Means for Solving the Problems

A method for manufacturing a silicon carbide semiconductor device according to the invention includes: (a) performing ion implantation to a silicon carbide layer; (b) performing activation annealing to the ion-implanted silicon carbide layer; (c) removing a surface layer of the silicon carbide layer, to which the activation annealing has been performed, by dry etching; (d) forming a sacrificial oxide film on a surface layer of the silicon carbide layer, to which the dry etching has been performed, by performing sacrificial oxidation thereto; and (e) removing the sacrificial oxide film by wet etching.

Effects of the Invention

According to the method for manufacturing a silicon carbide semiconductor device of the invention, the altered layer formed by activation annealing can be removed in a short time and surface irregularities such as bunching steps can be inhibited from being generated. Consequently, leakage current can be highly inhibited from increasing when the device is in a reverse bias state.

MODES FOR CARRYING OUT THE INVENTION

Embodiment 1

Steps for manufacturing a silicon carbide semiconductor device (silicon carbide Schottky diode; SiC-SBD) according to this embodiment are explained below on the basis of FIG. 1 to FIG. 8, which are diagrammatic sectional views of the SiC-SBD.

First, a substrate 1, which is constituted of 4H—SiC having a (0001) silicon face and is, for example, of the high-concentration n-type, is prepared. The resistivity of the substrate 1 is, for example, about 0.02 Ω·cm.

Figure 1:
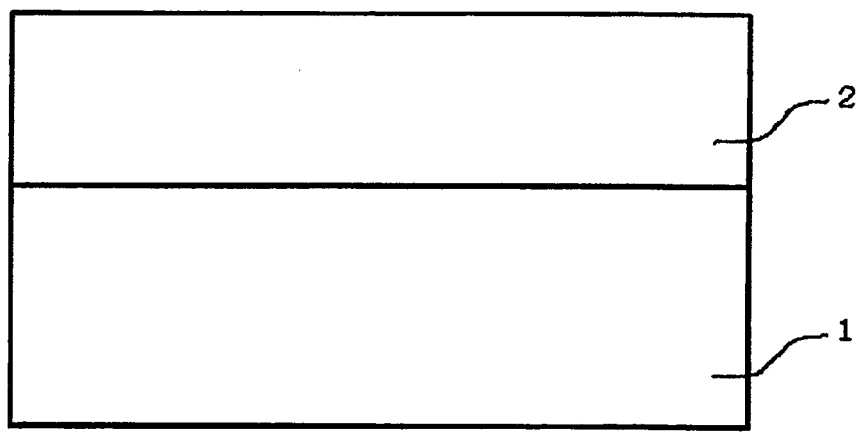
FIG. 1 is a view illustrating a step for manufacturing a silicon carbide semiconductor device according to embodiment 1.

Next, as shown in FIG. 1, an epitaxial layer 2 of a silicon carbide material of the low-concentration n-type having an impurity concentration of about $5 \times 10^{15}/cm^3$ is grown on the (0001) silicon face of the substrate 1. After forming the epitaxial layer 2, a thermal oxide film ($SiO_2$ thermal oxide film) may be formed on the surface of the epitaxial layer 2 by heating. In this case, this thermal oxide film functions as a process protection film.

Figure 2:
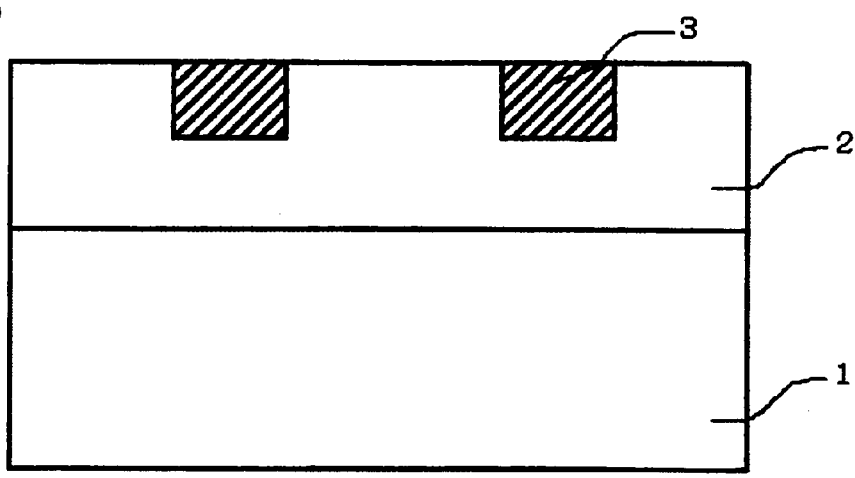
FIG. 2 is a view illustrating a step for manufacturing the silicon carbide semiconductor device according to the embodiment 1.

Subsequently, as shown in FIG. 2, in order to manufacture a p-type termination structure for ensuring resistance to voltages exceeding the order of kV, Al ions as a p-type dopant are implanted in a surface layer of the epitaxial layer 2 to selectively form a p-type-ion-implanted layer 3 to a depth of about 0.8 μm. This formation may be accomplished using an ion implantation mask formed from a photoresist by photolithography.

Although not shown in detail in FIG. 2, the layer 3 implanted with p-type ions is configured of a circular GR (Guard Ring) serving as a p-type termination structure and a JTE (Junction Termination Extension) for diminishing surface electric field, the JTE being continuously formed on the outer side of the GR. A p-type impurity concentration of the JTE is set at a value slightly lower than a p-type impurity concentration of the GR.

Next, the layer 3 implanted with p-type ions is activated in order to complete the p-type termination structure. For example, activation annealing, in which a high-temperature heat treatment is performed at 1,500-1,700° C. for 10 minutes or longer in an ordinary-pressure Ar (argon) atmosphere using, for example, an annealing furnace of the RTA (Rapid Thermal Annealing) type, is performed to the whole epitaxial layer 2.

Figure 3:
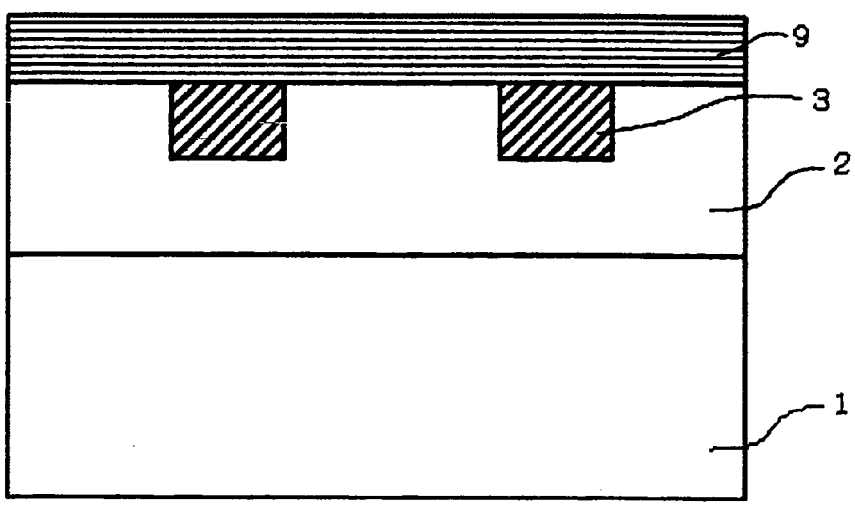
FIG. 3 is a view illustrating a step for manufacturing the silicon carbide semiconductor device according to the embodiment 1.

In performing the activation annealing, a graphite film 9 is formed on the surface of the epitaxial layer 2 beforehand as shown in FIG. 3. By forming the graphite film 9 beforehand, the irregularities called bunching steps can be more effectively prevented from being generated on the surface of the epitaxial layer 2. The graphite film 9 is removed after completion of the activation annealing.

By thus activating the impurity incorporated by ion implantation, the layer 3 implanted with the p-type ions is made to have a degree of activation of 50% or higher and sufficiently functions as a p-type termination structure. In addition, bunching steps of 1 nm or larger can be prevented from being generated on the surface of the epitaxial layer 2.

When activation annealing was conducted without forming a graphite film on the surface of the epitaxial layer 2, especially when the activation annealing was conducted at a high temperature, there were cases where bunching steps of about 20 nm were generated on the surface of the epitaxial layer 2 and these surface irregularities were sometimes causative of an increase in leakage current. Such generation of bunching steps of about 20 nm results in the generation of a (000-1) carbon face in the surface of the epitaxial layer 2 besides the (0001) silicon face. In general, when a layer of silicon carbide, such as the epitaxial layer 2, is heat-treated in an oxygen atmosphere, a $SiO_2$ thermal oxide film is formed on the silicon face and on the carbon face. The $SiO_2$ thermal oxide film thus formed on the carbon face has a thickness at least about ten times the thickness of the $SiO_2$ thermal oxide film formed on the silicon face. Consequently, when bunching steps of about 20 nm generates, the variation of the thickness of the $SiO_2$ thermal oxide film formed on the surface of the epitaxial layer 2 increases considerably.

This thickness variation of the thermal oxide film is causative of a trouble that the thermal oxide film locally remains even after wet etching (e.g., etching with hydrofluoric acid) for removing the thermal oxide film is conducted, and this is also a causative of an increase in leakage current. Meanwhile, the $SiO_2$ thermal oxide film is temporarily removed before the activation annealing.

Figure 4:
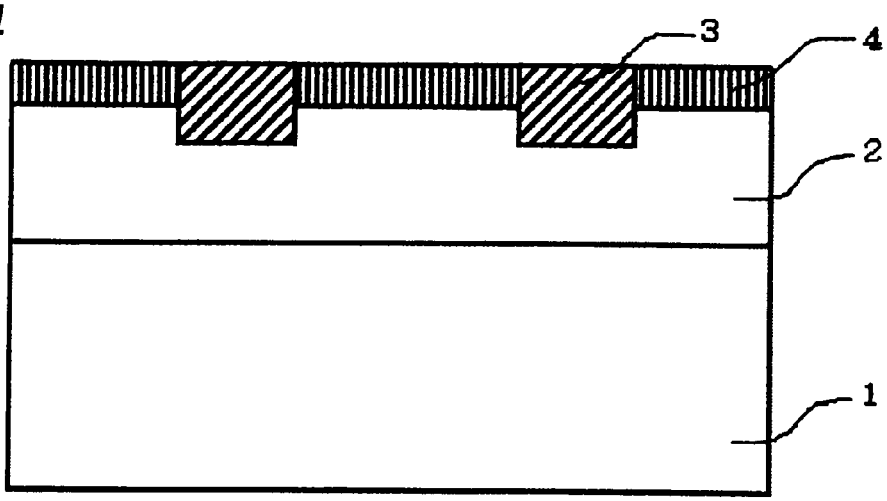
FIG. 4 is a view illustrating a step for manufacturing the silicon carbide semiconductor device according to the embodiment 1.

As shown in FIG. 4, an altered layer 4 generated by the activation annealing is generated in a surface layer of the epitaxial layer 2 to which the activation annealing has been performed. From the experimental results which will be described later, the thickness of the altered layer 4 generated by the activation annealing is thought to be about 100-200 nm. However, for forming a satisfactory Schottky junction, it is necessary to remove this altered layer 4 generated by the activation annealing.

Next, a method for removing the altered layer 4 generated by the activation annealing will be explained.

Figure 5:
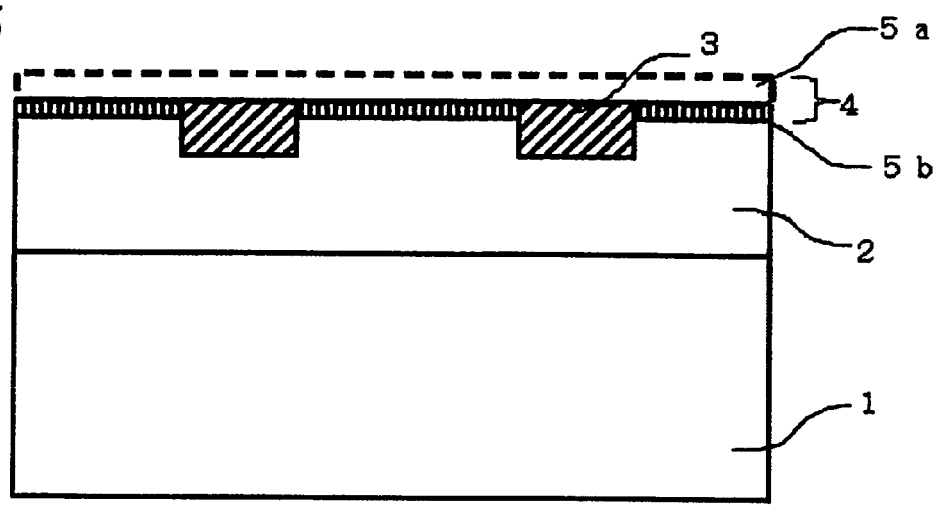
FIG. 5 is a view illustrating a step for manufacturing the silicon carbide semiconductor device according to the embodiment 1.

First, as shown in FIG. 5, the surface-layer side of the epitaxial layer 2 in which the altered layer 4 was generated by the activation annealing is dry-etched to thereby remove a surface layer having a thickness of, for example, about 120 nm. In FIG. 5, a part 5a removed by the dry etching is surrounded by the broken lines. Conditions for this etching is, for example, RIE (Reactive Ion Etching) processing, an $SF_6$ gas flow rate of 30 sccm, a treatment chamber pressure of 0.5 Pa, an etching period of 8 seconds, and an etching rate of about 7.5 nm/sec.

The newly exposed surface of the epitaxial layer 2, after the part 5a removed by the dry etching is removed, has a new altered layer 5b generated by the dry etching and having a thickness of, for example, less than about 20 nm. Subsequently, this new altered layer 5b generated by the dry etching is removed. In this stage, the residual lower part of the altered layer 4 generated by the activation annealing is in the state of being included in the altered layer 5b generated by the dry etching. Consequently, the residual lower part of the altered layer 4 generated by the activation annealing is removed by removing the altered layer 5b generated by the dry etching.

Figure 6:
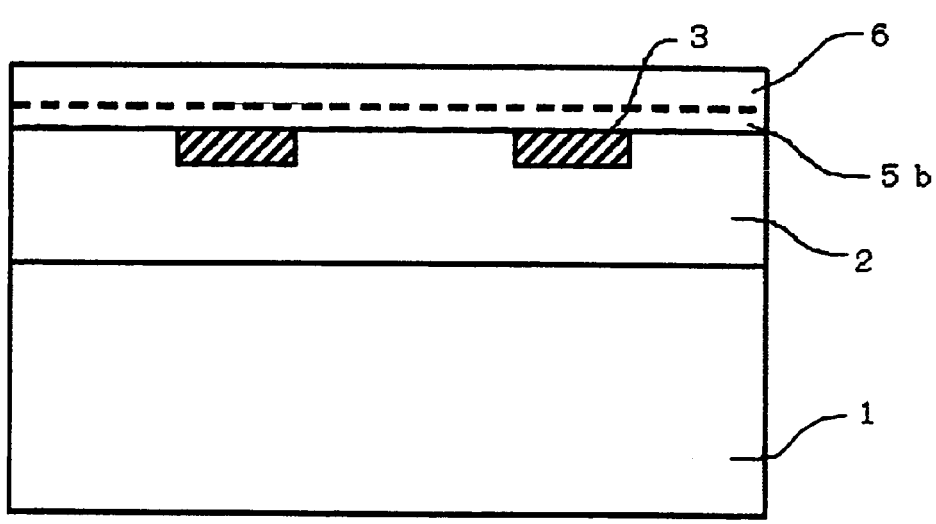
FIG. 6 is a view illustrating a step for manufacturing the silicon carbide semiconductor device according to the embodiment 1.
Figure 7:
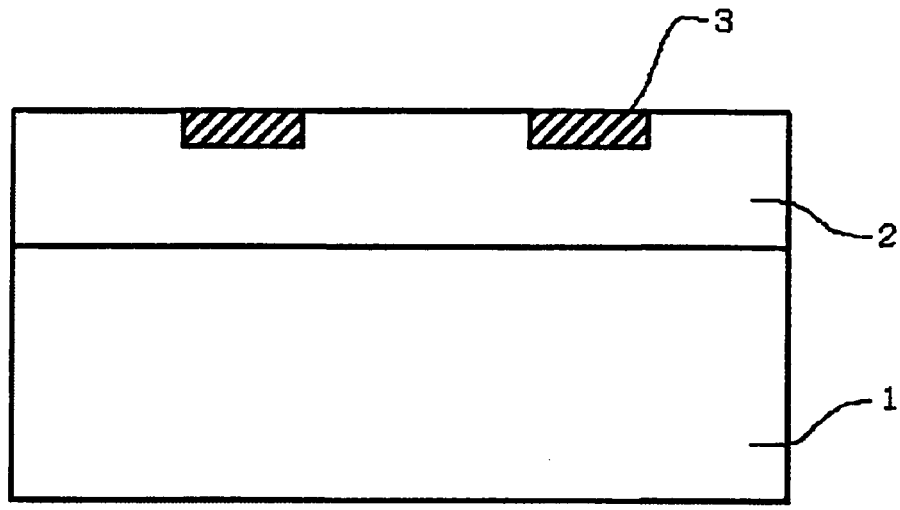
FIG. 7 is a view illustrating a step for manufacturing the silicon carbide semiconductor device according to the embodiment 1.

As shown in FIG. 6 and FIG. 7, the altered layer 5b generated by the dry etching is removed by sacrificially oxidizing a surface layer of the new surface of the epitaxial layer 2 and removing a sacrificial oxide film 6 formed by the sacrificial oxidation.

First, as shown in FIG. 6, a surface layer of the new surface of the epitaxial layer 2 is sacrificially oxidized to form, as a surface layer, a sacrificial oxide film ($SiO_2$ oxide film) 6 having a thickness of about 20 nm. The conditions of the sacrificial oxidation may be, for example, dry oxidation, 1,150° C. and an oxidation period of 2 hours.

Next, as shown in FIG. 7, the sacrificial oxide film 6 is removed by wet-etching the film 6, for example, with 10-fold diluted hydrofluoric acid for, for example, 5 minutes. In this manner, the altered layer 5b generated by the dry etching is removed together with the sacrificial oxide film 6. Thus, the lower part of the altered layer 4 generated by the activation annealing is removed together with the altered layer 5b generated by the dry etching.

As described above, the altered layer 4 generated by the activation annealing is removed by the removal of the surface layer 5a by dry etching and by the formation of a sacrificial oxide film 6 and removal thereof by wet etching. As a result, the surface of the epitaxial layer 2 comes into the state of having no altered layer.

An example of the thickness of the surface layer 5a to be removed by dry etching and the thickness of the film to be removed through sacrificial oxidation, in the case where the altered layer 4 generated by the activation annealing has a thickness of about 140 nm, is shown below. In the case where the thickness of the altered layer 4 generated by the activation annealing is about 140 nm, a thickness of a surface layer 5a removed by dry etching is about 120 nm, and the altered layer 4 generated by the activation annealing should be removed in a thickness of about 20 nm by the formation of a sacrificial oxide film 6 and subsequent removal thereof by wet etching (one operation using an oxidation period of 2 hours).

The thickness of the altered layer 4 generated by the activation annealing varies depending on the activation annealing conditions, etc. In the case where the thickness of the altered layer 4 generated by the activation annealing is more than 140 nm, a surface layer 5a is removed by dry etching in a thickness of 120 nm or more and the altered layer 4 generated by the activation annealing should be removed by increasing the thickness of the formation of the sacrificial oxide film 6 and the thickness of the removal thereof by wet etching, or by repeating the removing of the altered layer 4 in a thickness of about 20 nm, by the formation of a sacrificial oxide film 6 and removal thereof by wet etching, for a plurality of times.

The explanations given above were made on cases where the thickness of the surface altered layer 5b newly generated by dry etching is about 20 nm or less. When the thickness thereof is larger than 20 nm, a sacrificial oxide film 6 should be formed in a thickness larger than 20 nm accordingly. Although $SF_6$ gas was used as a gas for the dry etching, the thickness of the surface altered layer 5b to be generated by this dry etching can be regulated to 40 nm or less. Consequently, the thickness of the sacrificial oxide film 6 may be set at about 40 nm at the most in this case.

Figure 8:
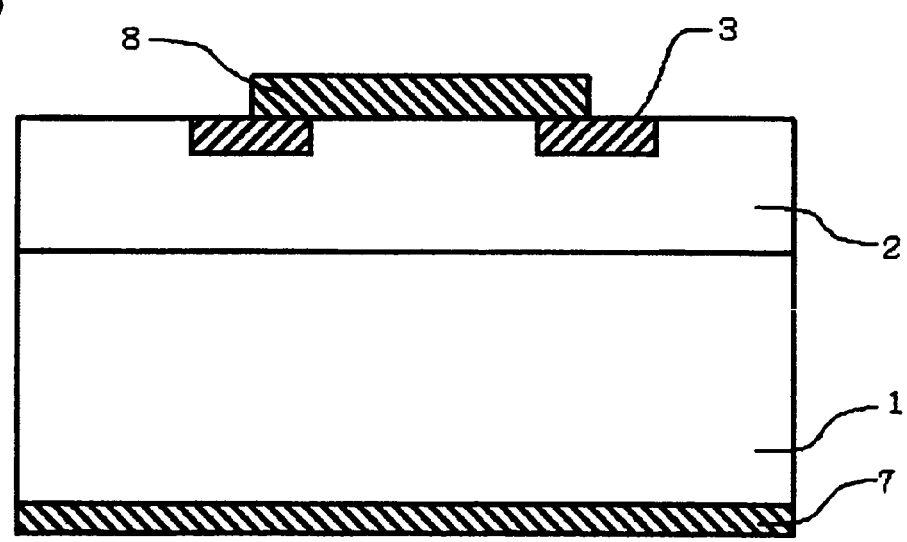
FIG. 8 is a view illustrating a step for manufacturing the silicon carbide semiconductor device according to the embodiment 1.

As described above, the altered layer 4 generated by the activation annealing, which includes the surface altered layer 5b formed midway by dry etching, is wholly removed from the epitaxial layer 2. Thereafter, as shown in FIG. 8, an ohmic electrode 7 constituted of, for example, nickel silicide is formed on substantially the whole back surface of the substrate 1, and a Schottky electrode 8 constituted of, for example, titanium metal is selectively formed on the surface of the epitaxial layer 2.

This operation may be performed in such a manner that the ohmic electrode 7, which requires a higher-temperature treatment after forming the electrode, is formed first, and the Schottky electrode 8 is thereafter formed and then subjected to a heat treatment.

Furthermore, although not shown in the figures, a metallic film for wire bonding is formed from a metal, e.g., Al, on the surface of the Schottky electrode 8, and a resinous film of, for example, a polyimide is formed on the metallic film so that the resinous film has an opening for wire bonding. Moreover, a metallic film for die bonding is formed from a metal, e.g., Ni or Au, on the surface of the ohmic electrode 7 disposed on the back surface of the substrate 1. Thus, a silicon carbide semiconductor device is manufactured.

An explanation is given below on the relationship between conditions for the removal of the altered layer 4 generated by the activation annealing and the effect of the removal, i.e., the proportion of accepted products in an inspection of SiC-SBDs. The conditions for the removal of the altered layer 4 generated by the activation annealing were expressed in terms of a combination of an etching amount removed by dry etching (RIE etching amount) and the number of operations for sacrificial oxidation in which a silicon carbide layer was oxidized in a thickness of about 20 nm per operation (number of sacrificial-oxidation operations). The proportion of accepted products was determined on the basis of whether the reverse-direction leakage current/reverse-direction voltage characteristics of the SiC-SBDs had a current density not higher than a given value or whether the reverse-direction leakage current did not show an abrupt increase until the reverse-direction voltage reached a given value or above.

The reason why sacrificial oxidation was carried out by separately performing a plurality of operations is that when a sacrificial oxide film is to be formed thickly, a period longer than the period which is in proportion to that thickness is required. Disregarding this problem, sacrificial oxidation may be carried out by performing one operation, or sacrificial oxidation of a shorter period may be repeated many times.

Figures 9, 10:
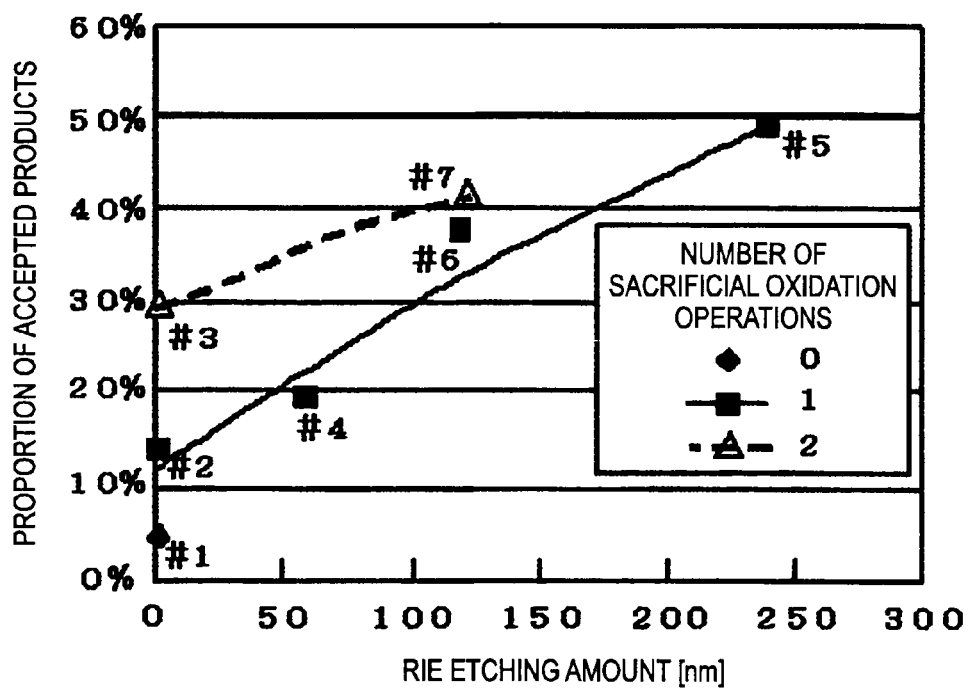
FIG. 9 is a diagram showing an experiment result of the proportion of accepted products among the silicon carbide semiconductor devices manufactured by a method for manufacturing a silicon carbide semiconductor device production according to the embodiment 1.
FIG. 10 is a diagram in which the experimental results given in FIG. 9 are shown by means of graphs indicating correlation between the proportion of accepted products and the amount of RIE etching.

In FIG. 9 is shown a table that summarizes the results of an examination in which seven kinds (#1 to #7) of SiC-SBDs, manufactured by using four RIE etching amounts of 0 nm, 60 nm, 120 nm, and 240 nm and three numbers of sacrificial-oxidation operations of 0, 1, and 2, were examined to determine the proportion of products accepted with respect to reverse-direction leakage current/reverse-direction voltage. FIG. 10 is a graph showing the results given in FIG. 9, the graph being obtained by plotting the proportion of accepted products as ordinate and the RIE etching amount as abscissa.

For example, with respect to the specifications for #1 in FIG. 9 and FIG. 10, silicon carbide semiconductor devices were manufactured under the conditions of an RIE etching amount of 0 nm, that is, omission of the dry etching by RIE, and the number of sacrificial-oxidation operations being 0, that is, omission of both the formation of a sacrificial oxide film 6 and removal thereof by wet etching. The results show that the proportion of products accepted with respect to reverse-direction characteristics in this case was 5%.

It can be seen from FIG. 9 and FIG. 10 that in the case where the RIE etching amount is 0 nm, the proportion of accepted products improves from 5% to 14% and to 30% as the number of sacrificial-oxidation operations increases from 0 to 1 and to 2. In the case where the RIE etching amount was 60 nm, the proportion of products accepted was examined only when the number of sacrificial-oxidation operations was 1. In this case, the proportion of accepted products was higher than in the case where the RIE etching amount was 0 nm. In the case where the ME etching amount was 120 nm, the proportion of products accepted was examined when the numbers of sacrificial-oxidation operations were 1 and 2. In this case, the proportions of accepted products were 38% and 41%, which do not differ significantly. However, these proportions of accepted products each are high as compared with the cases where the RIE etching amounts are 0 nm and 60 nm. Furthermore, in the case where the RIE etching amount was 240 nm, the proportion of products accepted was examined only when the number of sacrificial-oxidation operations was 1. In this case, however, the proportion of accepted products was 49%, which was the highest among the proportions of accepted products for the seven kinds of specifications.

Namely, FIG. 9 and FIG. 10 show a tendency that, within the range of the experiment, the effect of removing the altered layer 4 generated by activation annealing, i.e., the proportion of accepted products in the inspection of SiC-SBDs, becomes higher as the number of sacrificial-oxidation operations increases and as the RIE etching amount increases.

In the cases in which only the removal of a surface layer through sacrificial oxidation was performed (#1 to #3) and in the case in which the removal of a surface layer through sacrificial oxidation was performed in combination with the removal of a surface layer having a thickness of about 60 nm by RIE dry etching (#4), it was impossible to sufficiently remove the altered layer 4 generated by activation annealing, resulting in a proportion of accepted products as low as 30% at the most. In contrast, in the cases in which the removal of a surface layer through sacrificial oxidation was conducted in combination with the removal of a surface layer having a thickness of about 120 nm or more by RIE dry etching (#5 to #7), the altered layer 4 generated by activation annealing was sufficiently removed and the proportion of accepted products was greatly improved to about 40% or higher. In case where a surface layer having a thickness exceeding about 240 nm is removed by RIE dry etching, the removed ion-implanted region is too thick, and the ion-implanted region becomes too thin. It is therefore preferred that the thickness of the surface layer to be removed by RIE dry etching should be 240 nm or less.

It is, however, noted that in the case of current SiC-SBDs, there is the influence of crystal defects possessed by the silicon carbide substrate itself. Therefore, the proportions of accepted products shown in FIG. 10, etc. have been affected by the concentration of crystal defects in the silicon carbide substrate used, which is an adversely affecting factor other than whether the removal conditions were adequate or not.

As explained above, in view of the relationship shown in FIGS. 9 and 10 between the conditions for the removal of the altered layer 4 generated by activation annealing and the effect of the removal, it is preferred that the RIE etching of the epitaxial layer 2, which is a silicon carbide layer, should be performed so as to remove a thickness in the range of 120 nm to 240 nm, and it is preferred that the epitaxial layer 2, which is a silicon carbide layer, should subsequently be removed by sacrificial oxidation in a thickness in the range of about 20 nm to 40 nm.

As described above, the layer 3 implanted with p-type ions has a depth of about 0.8 µm. It is, therefore, necessary that, for finally making this layer retain the function of a JTE termination structure, a layer 3 implanted with p-type ions which has a depth of at least about 0.5 µm should remain even after the removal of the altered layer 4 generated by activation annealing. From also this restriction, the upper limit of the thickness in which the altered layer 4 generated by activation annealing is to be removed may be 0.3 µm, i.e., 300 nm, at the most.

According to the method for manufacturing a silicon carbide semiconductor device explained above, an upper part of the altered layer 4 generated by activation annealing, which is the surface layer of the epitaxial layer 2 which has been altered by activation annealing, is removed by dry etching and the remaining lower part is sacrificially oxidized and then removed by wet etching. As a result, the altered layer 4 generated by activation annealing can be removed in a short period, which is shorter than the processing period required in the case where the altered layer 4 generated by activation annealing is wholly sacrificially oxidized. When the dry etching is RIE dry etching, the processing can be carried out in a shorter period.

Furthermore, since the dry etching is RIE dry etching, the altered layer 4 generated by activation annealing can be removed without enhancing the surface irregularities of the epitaxial layer 2, in contrast to the case where the altered layer 4 generated by activation annealing is removed through long-term sacrificial oxidation or repetitions of sacrificial oxidation. Thus, leakage current can be highly inhibited from increasing in a reverse bias state.

Moreover, since the thickness of that surface layer of the epitaxial layer 2 which is removed by dry etching is in the range of 120 nm to 240 nm, the altered layer 4 generated by activation annealing can be sufficiently removed. As a result, leakage current can be highly inhibited from increasing in a reverse bias state. In case where a surface layer having a thickness exceeding about 240 nm is removed by RIE dry etching, the removed ion-implanted region is too thick, and the ion-implanted region becomes too thin. It is therefore preferred that the thickness of the surface layer to be removed by RIE dry etching should be 240 nm or less.

In addition, since the thickness of the silicon carbide epitaxial layer 2 which is removed through sacrificial oxidation is in the range of 20 nm to 40 nm, both the lower part of the altered layer 4 generated by activation annealing and the altered layer 5b generated by the dry etching can be sufficiently removed.

Furthermore, since $SF_6$ gas is used in the dry etching, a sufficiently high etching rate of about 7.5 nm/sec can be obtained (namely, the time required for dry etching can be reduced), and further, the surface layer of the epitaxial layer 2 can be etched without newly causing deep damage having a depth of 40 nm or more (alteration) thereto.

Although $SF_6$ gas was used as an example in the dry etching, as another etching gas, $CF_4$ or $NF_3$ may be used. Further, as a technique for dry etching, plasma etching or ECR etching may be used. For example, by using plasma etching, the processing can be performed with a less expensive process apparatus.

Embodiment 2

The method for manufacturing a silicon carbide semiconductor device according to this embodiment is the same as the production method according to the embodiment 1, except for the following. In the embodiment 1, an ohmic electrode 7 and a Schottky electrode 8 are formed after removal of the sacrificial oxide layer 6. In contrast, in the embodiment 2, formation of an ohmic electrode 7 and a subsequent high-temperature treatment are conducted while keeping the final sacrificial oxide layer 6 remaining unremoved. Thereafter, the final sacrificial oxide layer 6 is removed, and a Schottky electrode 8 is subsequently formed.

Figure 11:
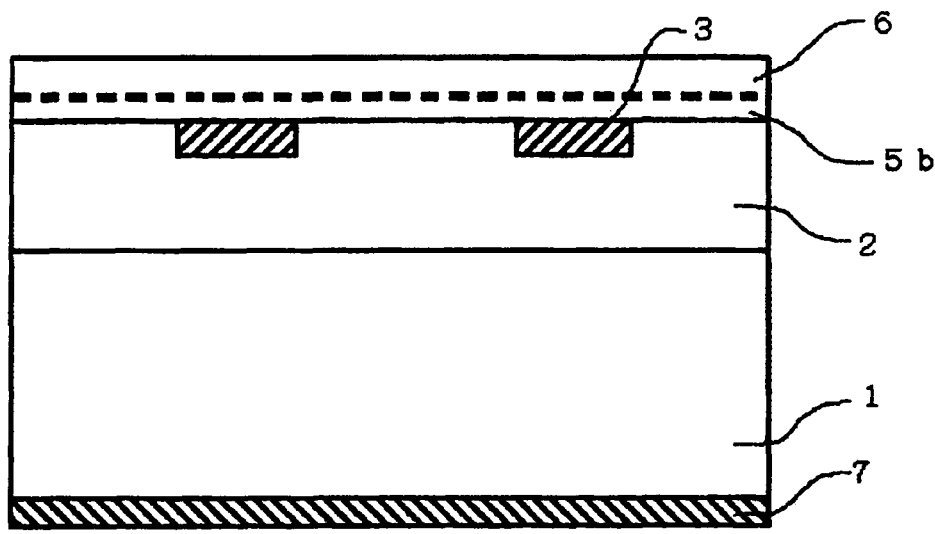
FIG. 11 is a view illustrating a step for manufacturing the silicon carbide semiconductor device according to embodiment 2.
Figure 12:
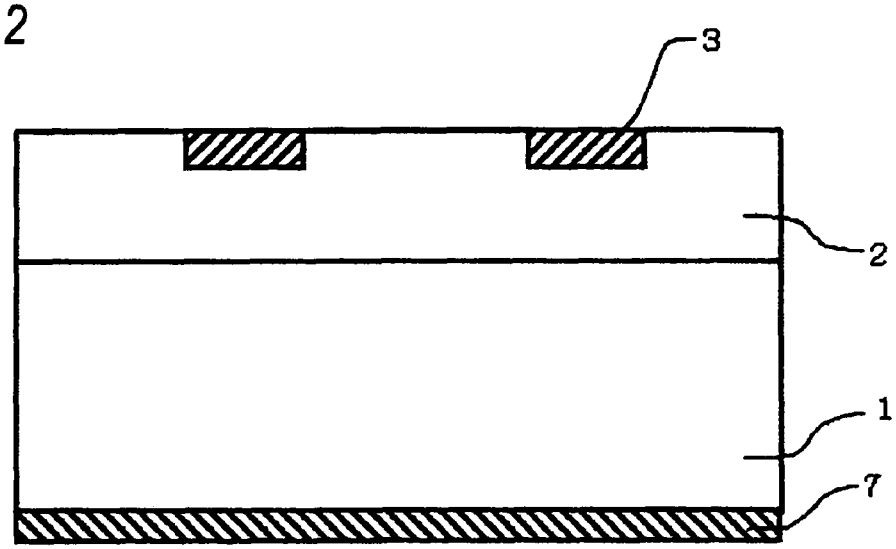
FIG. 12 is a view illustrating a step for manufacturing the silicon carbide semiconductor device according to the embodiment 2.

In this embodiment of the method for manufacturing silicon carbide semiconductor device, a substrate 1 is processed in the same manners as shown in FIGS. 1 to 6 of the embodiment 1 and, thereafter, an ohmic electrode 7 constituted of, for example, nickel silicide is formed on substantially the whole back surface of the substrate 1 as shown in FIG. 11. Subsequently, as shown in FIG. 12, the sacrificial oxide film 6 is removed by wet-etching the film 6, for example, with 10-fold diluted hydrofluoric acid for, for example, 5 minutes. Thereafter, a Schottky electrode 8 constituted of, for example, titanium metal is selectively formed on the surface of the epitaxial layer 2 in the same manner as shown by FIG. 8 of the embodiment 1.

According to this embodiment of the method for manufacturing a silicon carbide semiconductor device, the formation of an ohmic electrode 7 and a subsequent high-temperature treatment can be conducted while keeping the sacrificial oxide layer 6, which has been formed during the step of removing the altered layer 4 generated by activation annealing, remaining. Consequently, the epitaxial layer 2 can be protected during the formation of the ohmic electrode 7 and during the subsequent high-temperature treatment. As a result, a Schottky electrode 8 can be formed without newly causing new damage to the surface layer of the epitaxial layer 2, and the proportion of accepted products in an inspection of SiC-SBDs can be raised.

Embodiment 3

In the embodiment 1, a (0001) silicon face of silicon carbide was used as a surface on which a low-concentration n-type epitaxial layer 2 was grown, and a Schottky electrode 8 constituted of, for example, titanium was formed over the silicon face. Furthermore, in the embodiment 1, the surface (back surface of the substrate 1) on the reverse side from the silicon face was used as a silicon carbide (000-1) carbon face, and an ohmic electrode 7 constituted of, for example, nickel silicide was formed on the carbon face.

This embodiment is the same as the embodiment 1, except that a Schottky electrode 7 is formed on the (000-1) carbon face of the silicon carbide and an ohmic electrode 7 is formed on the (0001) silicon face of the silicon carbide. As described above with regard to the embodiment 1, a silicon oxide film is formed far thickly on the (000-1) carbon face of the silicon carbide than on the (0001) silicon face. Consequently, in this embodiment, even when a sacrificial oxide film formed on the (000-1) carbon face of the silicon carbide is thicker than that in the embodiment 1 or 2, this film formation does not necessitate a longer processing time.

For example, in the case where the altered layer 4 generated by activation annealing has a thickness of about 140 nm, the thickness of the part 5a to be removed by dry etching is set at, for example, about 60 nm, and the altered layer 4 generated by activation annealing is removed by repetitions of sacrificial oxidation and of removal of the sacrificial oxide film by wet etching in a thickness of, for example, about 80 nm (repeated two operations each for removing 40 nm).

Also in this embodiment of the method for manufacturing a silicon carbide semiconductor device, the proportion of accepted products in an inspection of SiC-SBDs can be raised through short-time processing.

DESCRIPTION OF THE REFERENCE NUMERALS AND SIGNS

1 silicon carbide substrate, 2 n-type epitaxial layer, 3 p-type-ion-implanted layer, 4 altered layer generated by activation annealing, 5a part removed by dry etching, 5b altered layer newly generated by dry etching, 6 sacrificial oxide film, 7 ohmic electrode, 8 Schottky electrode, 9 graphite film.

The invention claimed is:

1. A method for manufacturing a silicon carbide Schottky diode, the method comprising:
   (a) implanting ions, in an ion implantation, in a silicon carbide layer having a (0001) silicon surface or a (000-1) carbon surface to obtain an ion-implanted silicon carbide layer;
   (b) annealing, in an activation annealing, the ion-implanted silicon carbide layer to obtain an annealed silicon carbide layer;
   (c) removing a first surface layer of the annealed silicon carbide layer by a dry etching to obtain a dry etched silicon carbide layer;
   (d) forming a sacrificial oxide film on a second surface layer of the dry etched silicon carbide layer by performing sacrificial oxidation thereto;
   (e) removing the sacrificial oxide film by wet etching; and
   (f) forming a Schottky electrode on the surface layer from which the sacrificial oxide has been removed,
   wherein a thickness of the first surface layer removed by the dry etching is from 120 nm to 240 nm,
   wherein a thickness of 20 nm to 40 nm of the second surface layer is removed by the forming and removing of the sacrificial oxide film, and
   wherein the activation annealing comprises forming a graphite film on a surface of the ion-implanted silicon carbide layer.

2. The method of claim 1,
   wherein the dry etching is Reactive Ion Etching processing.

3. The method of claim 2,
   wherein the dry etching employs $SF_6$ gas.

4. The method of claim 1, further comprising:
   forming an ohmic electrode after forming the sacrificial oxide film and before removing the sacrificial oxide film by the wet etching.

5. The method of claim 1, wherein the sacrificial oxide film is formed by dry oxidation.

6. The method of claim 1, wherein, in (c), the entire first surface layer of the annealed silicon carbide layer is removed.

7. The method of claim 6, wherein, in (e), the entire sacrificial oxide film is removed.

8. The method of claim 1, wherein, in (e), the entire sacrificial oxide film is removed.

* * * * *